United States Patent
Shimizu

(10) Patent No.: US 10,249,381 B2
(45) Date of Patent: Apr. 2, 2019

(54) SEMICONDUCTOR MEMORY DEVICE AND DATA WRITE METHOD

(71) Applicant: TOSHIBA MEMORY CORPORATION, Minato-ku, Tokyo (JP)

(72) Inventor: Naoki Shimizu, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/702,270

(22) Filed: Sep. 12, 2017

(65) Prior Publication Data

US 2018/0261300 A1   Sep. 13, 2018

(30) Foreign Application Priority Data

Mar. 9, 2017 (JP) ................ 2017-045201

(51) Int. Cl.
| | |
|---|---|
| *G11C 11/34* | (2006.01) |
| *G11C 29/42* | (2006.01) |
| *G11C 11/16* | (2006.01) |
| *G11C 7/10* | (2006.01) |

(52) U.S. Cl.
CPC ............ *G11C 29/42* (2013.01); *G11C 7/1006* (2013.01); *G11C 11/1653* (2013.01); *G11C 11/1673* (2013.01); *G11C 11/1675* (2013.01)

(58) Field of Classification Search
CPC ... G11C 29/42; G11C 7/1006; G11C 11/1653; G11C 11/1673; G11C 11/1675

USPC .......................................... 365/185.09, 158
See application file for complete search history.

(56) References Cited

U.S. PATENT DOCUMENTS

| 7,774,676 B2 | 8/2010 | Chen |
| 2006/0253723 A1 | 11/2006 | Wu et al. |
| 2007/0091678 A1 | 4/2007 | Kato et al. |
| 2008/0046778 A1 | 2/2008 | Yoshida |
| 2011/0161784 A1 | 6/2011 | Selinger et al. |
| 2013/0061113 A1* | 3/2013 | Kim ............... G06F 11/1048 714/758 |
| 2015/0063014 A1 | 3/2015 | Sakai et al. |
| 2016/0048424 A1* | 2/2016 | Sakai ............. G06F 11/1008 714/764 |

FOREIGN PATENT DOCUMENTS

| JP | 4528242 B2 | 8/2010 |
| JP | 4908083 B2 | 4/2012 |

(Continued)

*Primary Examiner* — Huan Hoang
(74) *Attorney, Agent, or Firm* — Holtz, Holtz & Volek PC

(57) ABSTRACT

According to one embodiment, a semiconductor memory device includes a memory cell array with a plurality of memory cells, an ECC circuit with an encoder for generating error correcting codes and a decoder for performing correcting processing, a page buffer capable of storing the write data, corrected data, and the error correcting codes, and a multiplexer having a first input terminal coupled to the encoder, a second input terminal coupled to the page buffer, and an output terminal coupled to the memory cell array, in which the first input terminal is selected when writing the write data in the plurality of memory cells and the second input terminal is selected when writing the corrected data in the plurality of memory cells.

14 Claims, 10 Drawing Sheets

(56) References Cited

FOREIGN PATENT DOCUMENTS

| | | | |
|---|---|---|---|
| TW | 200639860 | A | 11/2006 |
| TW | 201135746 | A | 10/2011 |
| TW | 201513111 | A | 4/2015 |

* cited by examiner

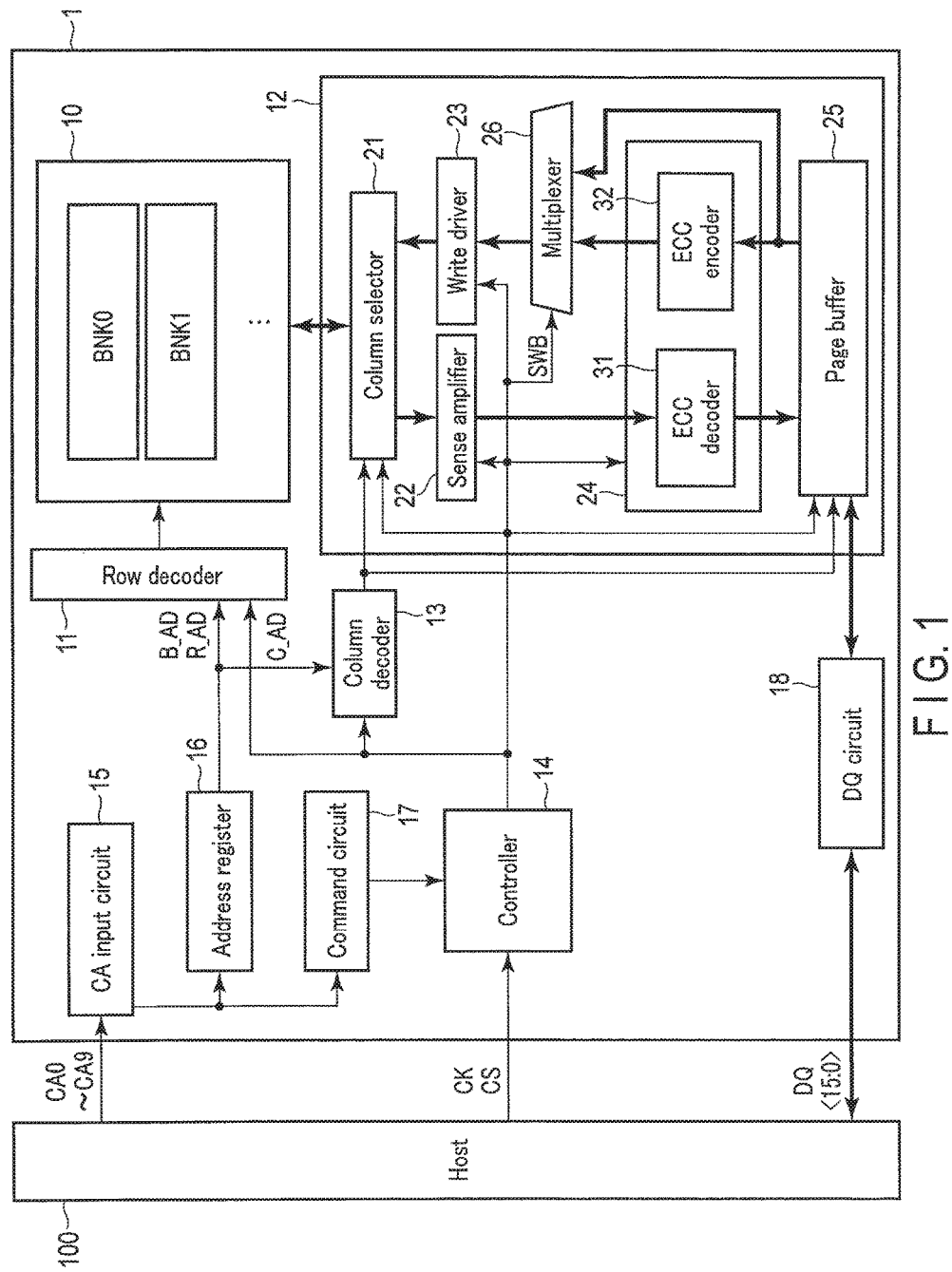
F I G. 1

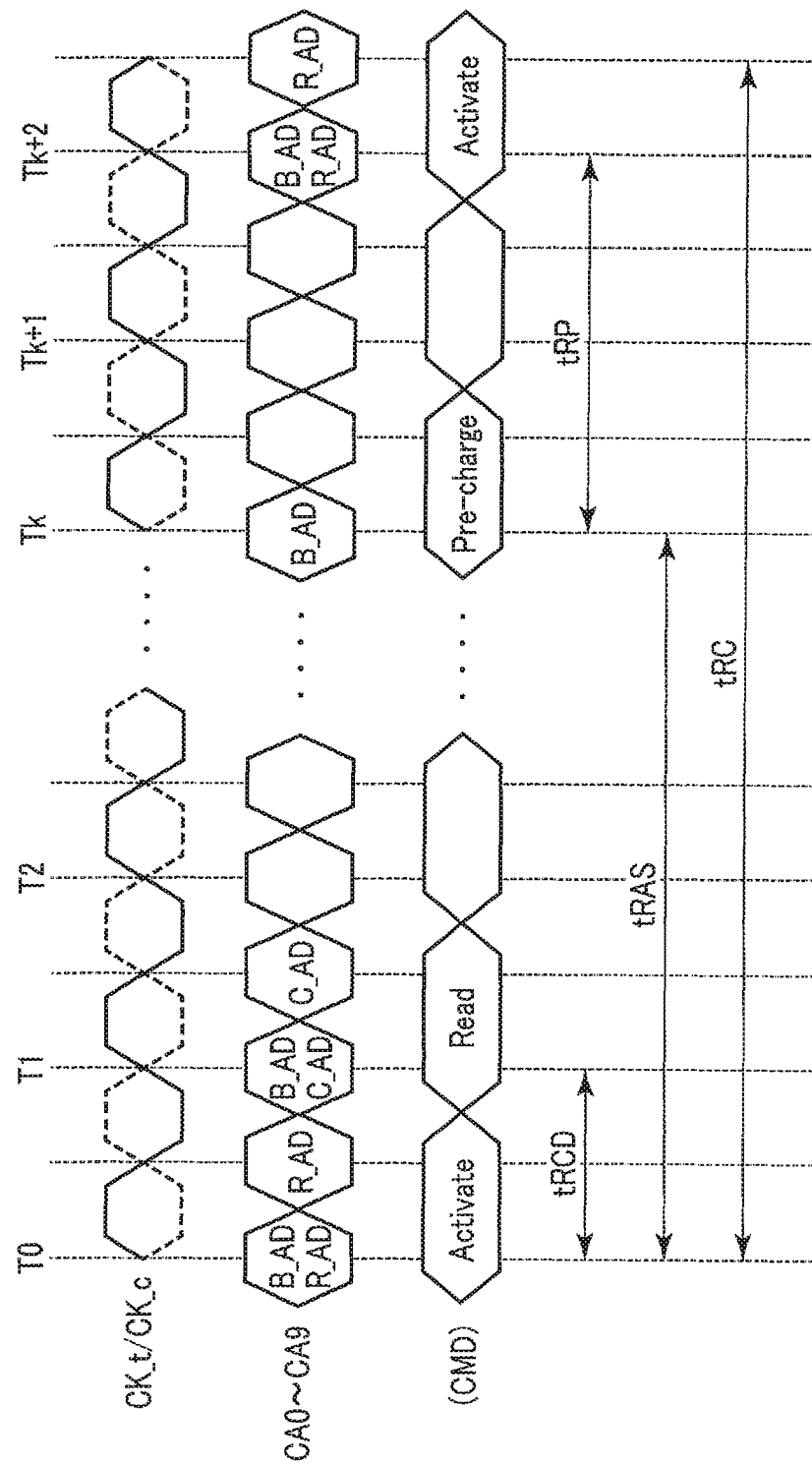
F I G. 4

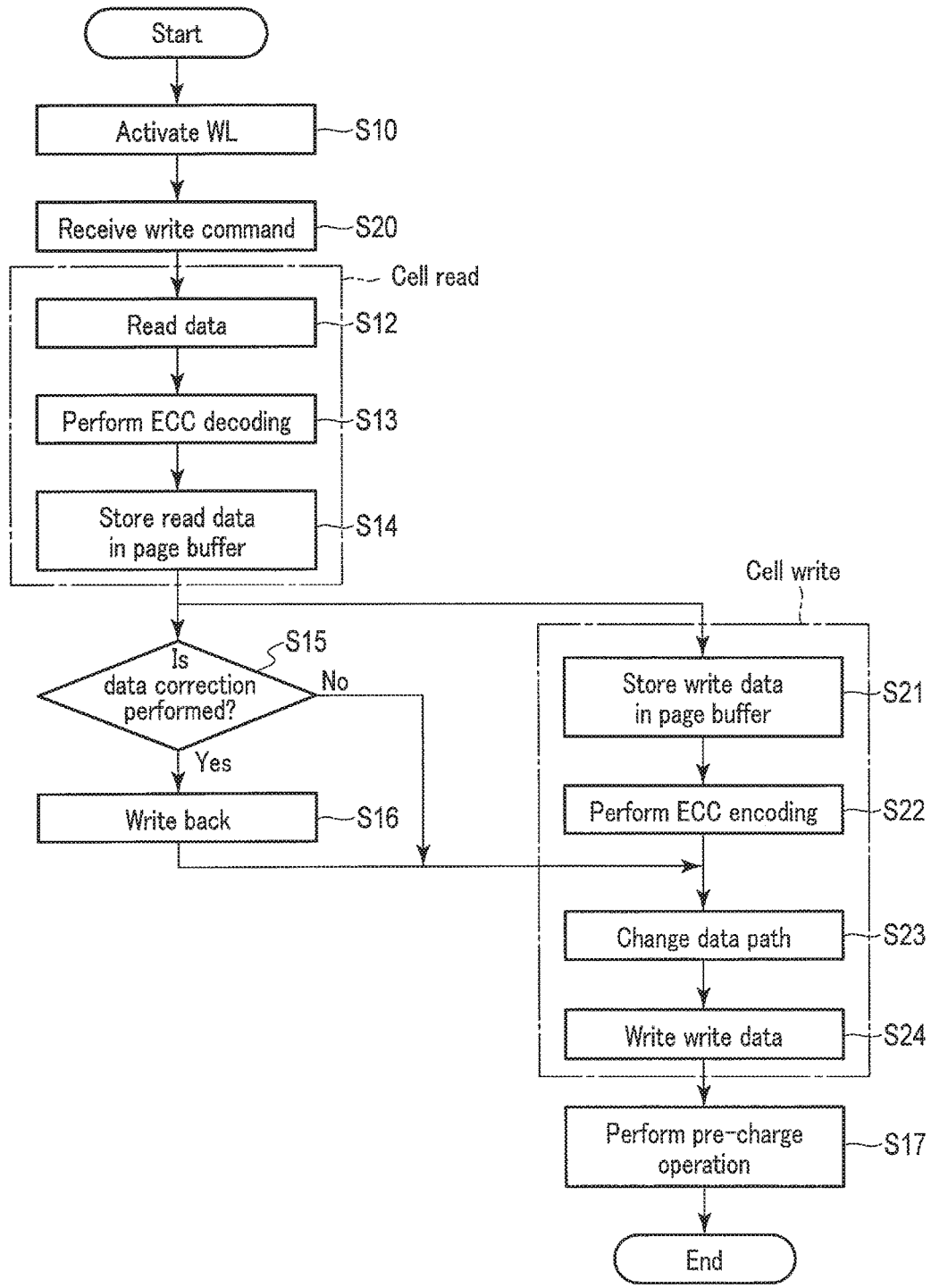
F I G. 5

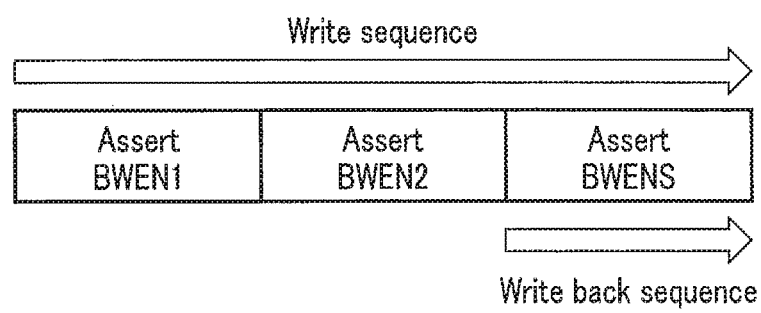
F I G. 7

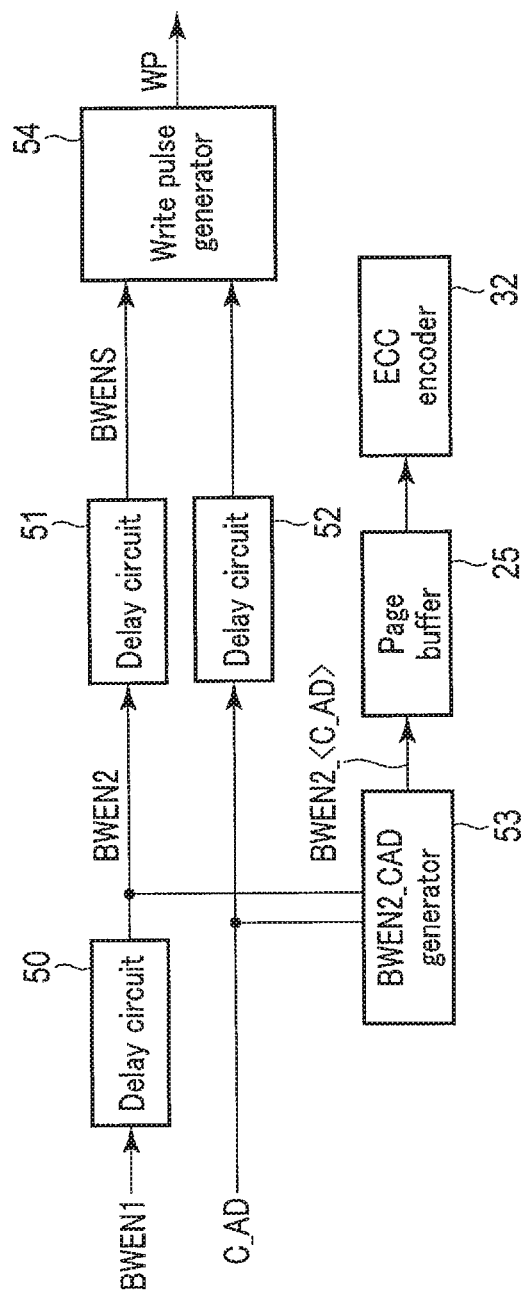
F I G. 8

| ACT_PULSE | BWEN2_<C_AD> | SWB |
|---|---|---|
| L | L | Holding of state |
| L | H | L |
| H | L | H |
| H | H | — |

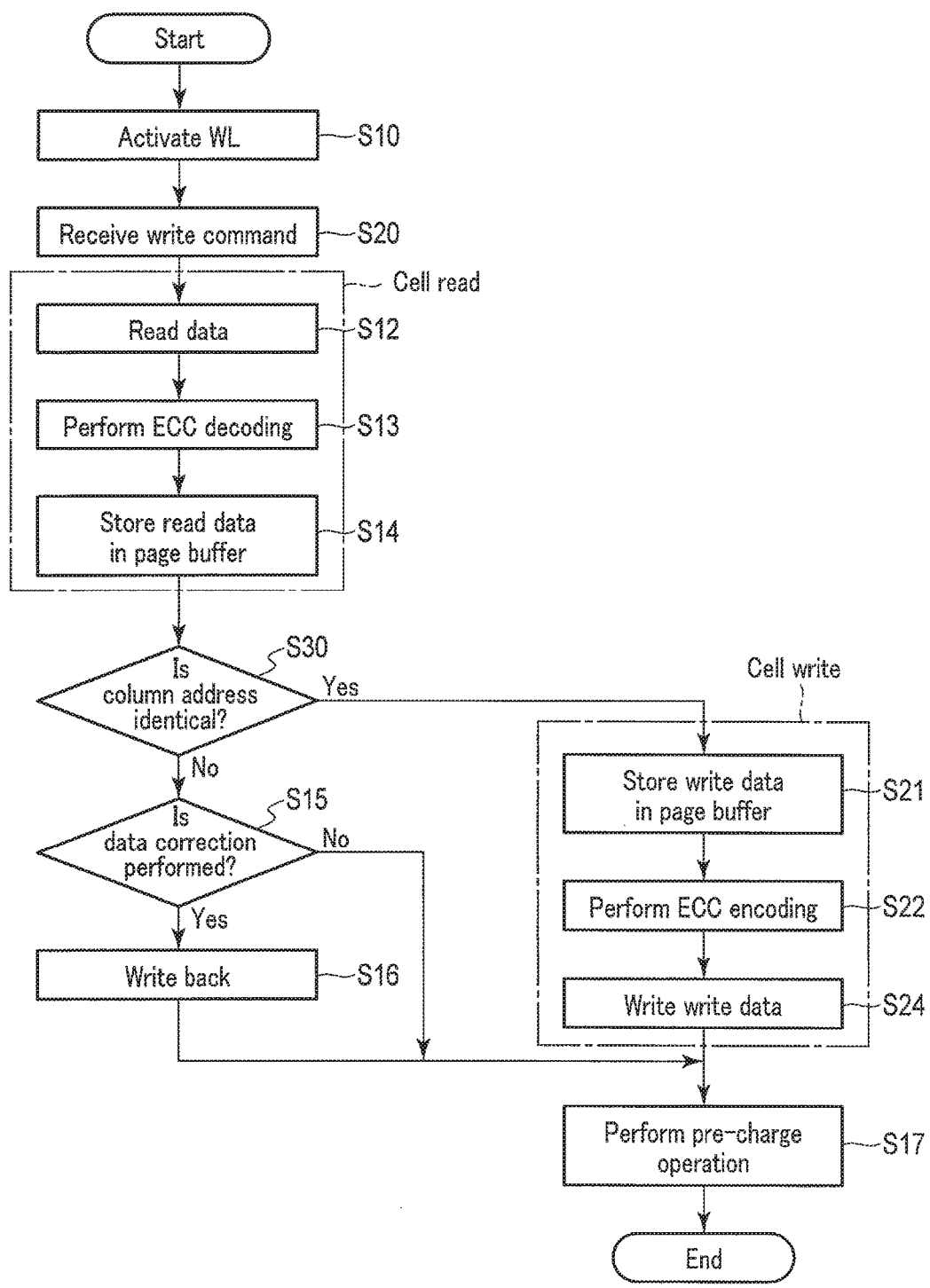
F I G. 11

SEMICONDUCTOR MEMORY DEVICE AND DATA WRITE METHOD

CROSS-REFERENCE TO RELATED APPLICATIONS

This application is based upon and claims the benefit of priority from Japanese Patent Application No. 2017-045201, filed Mar. 9, 2017, the entire contents of which are incorporated herein by reference.

FIELD

Embodiments described herein relate generally to a semiconductor memory device and a data read method.

BACKGROUND

As a type of semiconductor memory device, there is known a semiconductor memory device including a resistance change memory. As a type of resistance change memory, there is known an MRAM (Magnetoresistive Random Access Memory). The MRAM is a memory device that uses a magnetic element having the magnetoresistive effect as a memory cell for storing information, and is attracting attention as a next generation memory device characterized by a high speed operation, large capacity, and non-volatility. The MRAM has been studied and developed as a replacement for a volatile memory such as a DRAM or an SRAM.

BRIEF DESCRIPTION OF THE DRAWINGS

FIG. 1 is a block diagram showing a semiconductor memory device according to the first embodiment;

FIG. 4 is a timing chart showing the read operation in the semiconductor memory device according to the first embodiment;

FIG. 5 is a flowchart illustrating a write operation in the semiconductor memory device according to the first embodiment;

FIG. 7 is a flowchart illustrating the difference between a write sequence and a write-back sequence in a semiconductor memory device according to the second embodiment;

FIG. 8 is a block diagram showing transmission/reception of write enable signals in the semiconductor memory device according to the second embodiment;

FIG. 11 is a flowchart illustrating a write operation in the semiconductor memory device according to the third embodiment.

DETAILED DESCRIPTION

Figure 2:
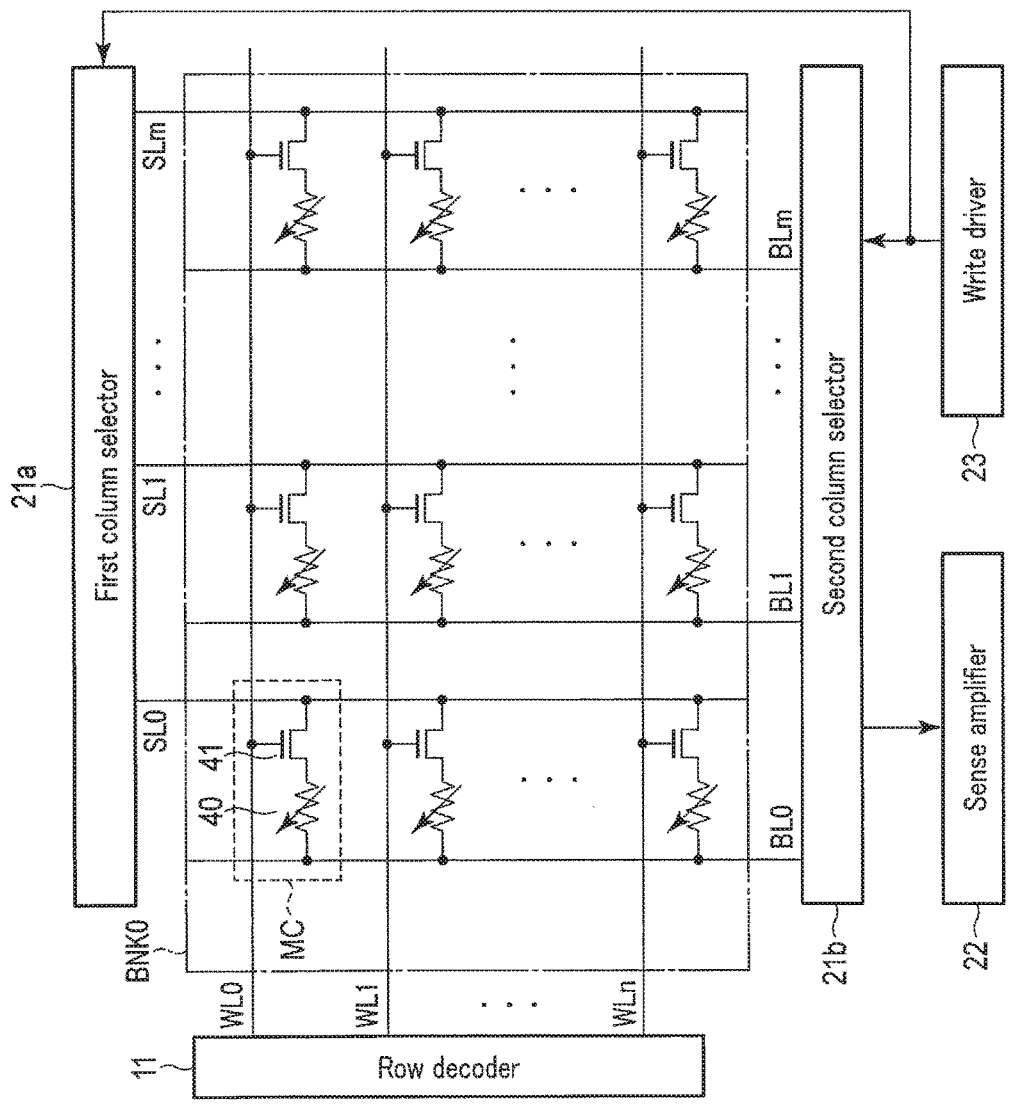
FIG. 2 is a circuit diagram showing a memory cell array in the semiconductor memory device according to the first embodiment.

In general, according to one embodiment, a semiconductor memory device includes a memory cell array with a plurality of memory cells, an ECC (Error Checking and Correcting) circuit with an encoder for generating error correcting codes when writing write data in the plurality of memory cells, and a decoder for performing, when reading read data from the plurality of memory cells, correcting processing of the read data based on the error correcting codes, a page buffer capable of storing the write data, corrected data corrected by the correcting processing of read data, and the error correcting codes used for the correcting processing, and a multiplexer having a first input terminal coupled to the encoder, a second input terminal coupled to the page buffer, and an output terminal coupled to the memory cell array, in which the first input terminal is selected when writing the write data in the plurality of memory cells and the second input terminal is selected when writing the corrected data in the plurality of memory cells.

1. First Embodiment

A semiconductor memory device according to the first embodiment will be described. A case in which the semiconductor memory device is an STT-MRAM (Spin Transfer Torque Magnetoresistive Random Access Memory) will be exemplified below.

1.1 Overall Configuration of Semiconductor Memory Device

The overall configuration of the semiconductor memory device will be described first with reference to FIG. 1. Note that an example of FIG. 1 shows some of interconnects (buses) that couple respective blocks for the sake of descriptive simplicity.

As shown in FIG. 1, a semiconductor memory device 1 includes a memory cell array 10, a row decoder 11, a column controller 12, a column decoder 13, a controller 14, a CA input circuit 15, an address register 16, a command circuit 17, and a DQ circuit 18.

The memory cell array 10 includes a plurality of banks BNK (BNK0, BNK1, . . . ) each including a plurality of memory cells for storing data. For example, the plurality of banks BNK can individually perform a data write or read operation. Note that the number of banks BNK can be arbitrarily set.

The row decoder 11 decodes a bank address B_AD for selecting one bank BNK and a row address R_AD in the selected bank BNK. The row decoder 11 selects a word line coupled to the memory cell array 10 in accordance with a decoding result.

The column decoder 13 decodes, for example, a column in the memory cell array 10, more specifically, a column address C_AD for selecting at least one of a bit lines and at least one of a source lines. The column decoder 13 transmits a decoding result to the column controller 12.

The column controller 12 controls data read and write with respect to the selected column. The column controller 12 includes a column selector 21, a sense amplifier 22, a write driver 23, an ECC (Error Checking and Correcting) circuit 24, a page buffer 25, and a multiplexer 26.

The column selector 21 is coupled to a plurality of bit lines, a plurality of source lines, the sense amplifier 22, and the write driver 23. The column selector 21 selects columns, that is, a plurality of corresponding bit lines and a plurality of source lines based on the decoding result of the column decoder 13, and couples them to the sense amplifier 22 or the write driver 23. The column selector 21 according to this embodiment includes first and second column selectors (to be described later). The first column selector corresponds to the plurality of source lines and the second column selector corresponds to the plurality of bit lines.

The sense amplifier 22 is coupled to the plurality of bit lines and the plurality of source lines that have been selected by the column selector 21. The sense amplifier 22 detects a current flowing through each of the plurality of selected memory cells as read targets, thereby collectively reading data stored in the plurality of selected memory cells (the unit of the memory cells from which data are collectively read will be referred to as a "page" hereinafter).

The write driver 23 is coupled to the plurality of bit lines and the plurality of source lines that have been selected by the column selector 21. The write driver 23 applies a write voltage (write pulse) to the plurality of selected memory cells as write targets. When the write current flows through the selected memory cells, data are written in the selected memory cells. Data are collectively written in the plurality of memory cells.

The ECC circuit 24 executes data error correcting processing. More specifically, in a write operation, the ECC circuit 24 generates error correcting codes (to be referred to as "parity bits" hereinafter) using write data input from a host 100 (for example, a memory controller). In the read operation, the ECC circuit 24 checks based on parity bits whether each of data (to be referred to as "read data" hereinafter) read from the selected memory cells includes an error. If an error in the data is detected, the ECC circuit 24 corrects the detected error. For the sake of descriptive simplicity, a case in which data read out on a page basis collectively undergo ECC processing will be described below. Note that the data length collectively undergoing ECC processing by the ECC circuit 24 need not be the same as the data length of the page. The column controller 12 writes back the error-corrected data (to be referred to as "corrected data" hereinafter) to the same address in the memory cell array 10. An operation of writing back the corrected data into the memory cell array 10 will be referred to as "write-back" hereinafter. For example, if no error is detected in the read data, the write-back operation need not be executed. The ECC circuit 24 includes an ECC decoder 31 and an ECC encoder 32.

The ECC decoder 31 is coupled to the sense amplifier 22 and the page buffer 25. The ECC decoder 31 corrects an error in the read data using the parity bit included in the read data. The corrected data and parity bit are temporarily stored in the page buffer 25.

The ECC encoder 32 is coupled to the page buffer 25 and the multiplexer 26. The ECC encoder 32 encodes the write data input from the host 100 via the page buffer 25, thereby generating parity bits. The generated parity bits are added to the write data, and written in the memory cell array 10.

The page buffer 25 temporarily stores the write data and the read data (including the parity bits). More specifically, in the write operation, the page buffer 25 temporarily stores the write data transferred from the DQ circuit 18. The write data are then transferred to the ECC encoder 32. Furthermore, in the read operation, the page buffer 25 temporarily stores the read data (corrected data) and the parity bits. The read data (corrected data) are transferred to the DQ circuit 18.

The multiplexer 26 has the first input terminal coupled to the ECC encoder 32, the second input terminal coupled to the page buffer 25, and an output terminal coupled to the write driver 23. The multiplexer 26 couples one of the ECC encoder 32 and the page buffer 25 to the write driver 23 based on a control anal SWB transmitted from the controller 14. More specifically, if the page buffer 25 holds the corrected data and parity bits, the multiplexer 26 couples the second input terminal and the output terminal. If the page buffer 25 holds the write data, the multiplexer 26 couples the first input terminal and the output terminal.

The CA input circuit 15 is coupled to the host 100 via, for example, 10 command/address lines CA0 to CA9. The command/address lines CA0 to CA9 serve as a unidirectional bus. The CA input circuit 15 receives a command and an address signal from the host 100 via the command/address lines CA0 to CA9. The command received by the CA input circuit 15 is a command for controlling the operation of the bank BNK, and includes, for example, an active command, a pre-charge command, a write command, a read command, and a reset command. The pre-charge command is a command for setting the selected bank BNK in an initial state (pre-charge state) for the read operation or write operation. More specifically, when performing a pre-charge operation, all the word lines, all the bit lines, and all the source lines are deactivated (set in an unselected state). The active command is a command for activating (selecting) one bank BNK, and activating (selecting) one of the plurality of word lines in the selected bank BNK. The CA input circuit 15 is coupled to the address register 16 and the command circuit 17. The CA input circuit 15 transmits the received address signal to the address register 16, and transmits the received command to the command circuit 17.

The address register 16 is coupled to the row decoder 11 and the column decoder 13. The address register 16 transmits, to the row decoder 11, the bank address B_AD and the row address R_AD for designating a row (that is, a word line) in the bank BNK selected by the bank address B_AD, and transmits, to the column decoder 13, the column address C_AD for designating a column (that is, a bit line and a source line) in the selected BNK.

The command circuit 17 decodes the command, and transmits a decoding result to the controller 14.

The DQ circuit 18 is coupled to the host 100 via, for example, 16 data lines DQ<15:0>. The data lines DQ<15:0> serve as a bidirectional data path. Furthermore, the DQ circuit 18 is coupled to the page buffer 25. The DQ circuit 18 receives the input data (write data) from the host 100 via the data lines DQ<15:0>, and transmits the received write data to the column controller 12 (more specifically, the page buffer 25). The DQ circuit 18 outputs output data (read data) stored in the page buffer 25 to the host 100 via the data lines DQ<15:0>. Note that the number of data lines DQ is arbitrary.

The controller 14 controls the overall operation of the semiconductor memory device 1. More specifically, the controller 14 controls, for example, the row decoder 11, the column decoder 13, the column controller 12 (column selector 21, sense amplifier 22, write driver 23, ECC circuit 24, page buffer 25, and multiplexer 26), and the DQ circuit 18. The controller 14 receives, from the host 100, various control signals, for example, a clock signal CK, a clock enable signal CKE, and a chip select signal CS. The controller 14 controls, for example, the read operation and the write operation in accordance with the command transmitted from the command circuit 17.

1.2 Configuration of Memory Cell Array

The configuration of the memory cell array 10 will be described with reference to FIG. 2. An example of FIG. 2 shows the bank BNK0 of the memory cell array 10 but the remaining banks BNK have the same configuration.

As shown in FIG. 2, the bank BNK0 is formed by arranging a plurality of memory cells MC in a matrix. The bank BNK0 is provided with a plurality of word lines WL (WL0 to WLn where n is an integer of 1 or more) in a row direction, and provided with a plurality of bit lines BL (BL0 to BLm where m is an integer of 1 or more) and a plurality of source lines SL (SL0 to SLm) in a column direction. One word line WL is coupled to the plurality of memory cells MC arranged in the row direction, and a pair of the bit line BL and source line SL is coupled to the plurality of memory cells MC arranged in the column direction. When one word line WL and a pair of the bit line BL and source line SL are selected, one memory cell MC is selected.

Each memory cell MC includes a magnetoresistive effect element (MTJ (Magnetic Tunnel Junction) element) 40 and a selection transistor 41. The selection transistor 41 may be, for example, an N-chancel MOSFET.

One terminal of the MTJ element 40 is coupled to the corresponding bit line BL, and the other terminal of the MTJ element 40 is coupled to the drain (source) of the selection transistor 41. The gate of the selection transistor 41 is coupled to the corresponding word line WL, and the source (drain) of the selection transistor 41 is coupled to the corresponding source line SL.

Note that the above-described arrangement of the bank BNK is an example, and the bank BNK may have another configuration.

The column selector 21 includes a first column selector 21a coupled to the plurality of source lines SL and a second column selector 21b coupled to the plurality of bit lines BL. The first column selector 21a selects the plurality of source lines SL based on the decoding result of the column decoder 13. In the write operation, the first column selector 21a transfers the voltage applied by the write driver 23 to the plurality of selected source lines SL. The second column selector 21b selects the plurality of bit lines BL based on the decoding result of the column decoder 13. In the write operation, the second column selector 21b transfers the voltage applied by the write driver 23 to the plurality of selected bit lines BL. In the read operation, the second column selector 21b transfers the voltages of the plurality of bit lines BL to the sense amplifier 22.

The row decoder 11 is coupled to the plurality of word lines WL provided in the bank BNK.

1.3 Read Operation 1.3.1 Overview of Read Operation

An overview of the read operation according to this embodiment will be described with reference to FIG. 3. The read operation according to this embodiment includes an operation (to be referred to as "cell read" hereinafter) of reading data from the selected memory cells and a writing back operation of corrected data. More specifically, the cell read includes read of the read data, ECC processing, and store the read data in the page buffer 25. In this embodiment, the cell read and the write-back operation are successively performed.

Figure 3:
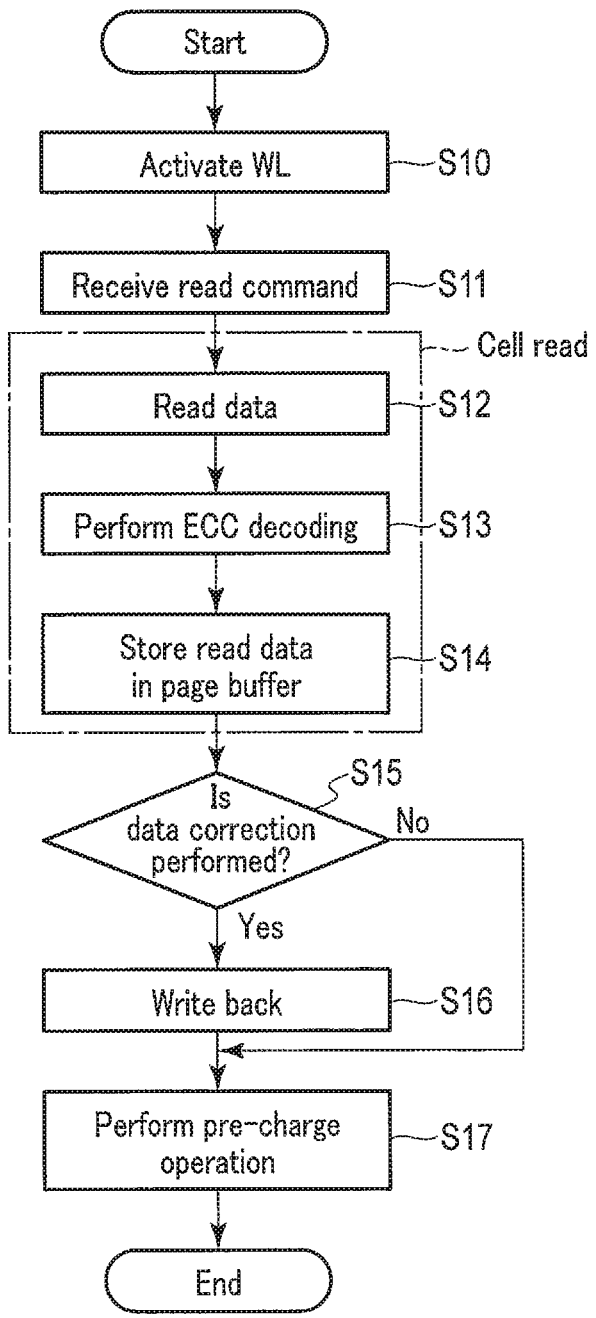
FIG. 3 is a flowchart illustrating a read operation in the semiconductor memory device according to the first embodiment.

As shown in FIG. 3, upon receiving the active command and the address signal from the host 100, the row decoder 11 activates the selected word line WL of the selected bank BNK (step S10). More specifically, the CA input circuit 15 receives the active command, bank address B_AD, and row address R_AD via the command/address lines CA0 to CA9. Then, the CA input circuit 15 transmits the bank address B_AD and the row address R_AD to the row decoder 11 via the address register 16. The CA input circuit 15 transmits the decoded active command to the controller 14 via the command circuit 17. Upon receiving the active command, the controller 14 instructs the row decoder 11 to perform activation. The row decoder 11 decodes the bank address B_AD and the row address R_AD. In accordance with a decoding result, the row decoder 11 activates one bank BNK, and also activates the selected word line WL in the activated bank BNK.

The controller 14 receives the read command (step S11). More specifically, the CA input circuit 15 receives the read command and the column address C_AD via the command/address lines CA0 to CA9. The CA input circuit 15 transmits the decoded read command to the controller 14 via the command circuit 17. The CA input circuit 15 transmits the column address C_AD to the column decoder 13. The column decoder 13 transmits the result of decoding the column address C_AD to the column controller 12.

The column controller 12 reads the data of the selected memory cells MC of the selected bank BNK (step S12). More specifically, upon receiving the read command, the controller 14 instructs the column controller 12 to read the data. The column selector 21 in the column controller 12 selects the plurality of bit line BL and the plurality of source line SL in accordance with the decoding result. The sense amplifier 22 transmits, to the ECC decoder 31, the read data and parity bits read via the selected bit lines BL.

The ECC decoder 31 performs ECC processing for the read data using the parity bits (step S13).

The column controller 12 stores the read data in the page buffer 25 (step S14). More specifically, if the read data are not corrected, the read data and parity bits are stored in the page buffer 25. If the read data are corrected, the corrected data and parity bits are stored in the page buffer 25.

Steps S12 to S14 in FIG. 3 correspond to the cell read.

If the ECC decoder 31 corrects the data (YES in step S15), the column controller 12 performs a write-back operation (step S16). More specifically, the corrected data and parity bits stored in the page buffer 25 are written back to the selected memory cells MC. At this time, the second input terminal of the multiplexer 26 is selected in accordance with the control signal SWB to couple the write driver 23 and the page buffer 25. The column controller 12 outputs the corrected data stored in the page buffer 25 to the host 100 via the DQ circuit 18 and the data lines DQ<15:0>.

If the ECC decoder 31 corrects no data (NO in step S15), the column controller 12 outputs the read data stored in the page buffer 25 to the host 100 without performing the write-back operation.

Upon receiving the pre-charge command and the address signal from the host 100, the row decoder 11 and the column controller 12 perform the pre-charge operation (deactivation) for the selected bank BNK (step S17). This ends the read operation. Note that if the write or read operation is successively performed in the selected word line WL of the selected bank BNK, the pre-charge operation may be skipped.

1.3.2 Command Sequence of Read Operation

The command sequence of the read operation will be described with reference to FIG. 4. An example of FIG. shows a case in which data are read from the bank BNK0, and the same applies to a case in which another bank BNK is selected. The semiconductor memory device 1 according to this embodiment operates in synchronism with the timing of an internal clock CLK (clock CK_t and complementary clock CK_c). The semiconductor memory device 1 receives the command/address and the like from the host 100 when the clock CK_t and complementary clock CK_c intersect each other.

As shown in FIG. 4, at time T0, the semiconductor memory device 1 receives an active command (reference symbol "Activate") associated with the bank BNK0 from the host 100. Note that at the timings of the rising edge and falling edge of the clock CK_t (and the clock CK_c) when the active command is input, the bank address B_AD and the row address R_AD are input from the host 100. Then, the bank address B_AD and the row address R_AD are set in the address register 16. This activates the selected word line WL.

At time T1 when a period "tRCD (RAS to CAS delay)" elapses after time T0, the semiconductor memory device 1 receives a read command (reference symbol "Read") associated with the selected bank BNK0 from the host 100 subsequently to the active command. At the timings of the rising edge and falling edge of the clock CK_t (and the clock CK_c) when the read command is input, the bank address B_AD and the column address C_AD are input from the host 100. Then, the bank address B_AD and the column address C_AD are set in the address register 16. This starts the read operation. Note that the period "tRCD" (RAS to CAS delay) indicates a period from when the active command is accepted until the read command (a write command in the case of the write operation) is accepted. In addition, "RAS" indicates a row address strobe, and "CAS" indicates a column address strobe. Although an input operation is performed twice to input each of the row address R_AD and the column address C_AD to the semiconductor memory device 1, the number of input operations can be arbitrarily set.

At time Tk (k is an integer of 3 or more) when a period "tRAS (Row Active time)" elapses after time T0, that is, after the end of the read operation, the semiconductor memory device 1 receives a pre-charge command (reference symbol "Pre-charge") from the host 100. At the timing of the rising edge of the clock CK_t (and the clock CK_c) when the pre-charge command is input, the bank address B_AD is input from the host 100. This deactivates the selected bank BNK0. Note that the period "tRAS" (Row Active time) indicates a period from when the active command is accepted until the pre-charge command is accepted, that is, a period during which the selected bank BNK (word line WL) is active.

At time Tk+2 when a period "tRP (Row Pre-charge time)" elapses after time Tk, that is, after the end of the pre-charge operation, an active command for the next operation is received. The bank address B_AD received at this time may indicate the bank BNK0 or another bank BNK. Note that the period "tRP" (Row Pre-charge time) indicates a period from when the pre-charge command is accepted until the active command is accepted.

A period tRC (Active to Active command period) obtained by adding the periods tRAS and tRP indicates the period of one read operation (or write operation).

1.4 Write Operation 1.4.1 Overview of Write Operation

The write operation according to this embodiment will be described with reference to FIG. 5. The write operation according to this embodiment includes cell read corresponding to a page including the column address C_AD as a write target, a write-back operation, and an operation (to be referred to as "cell write" hereinafter) of writing the write data. Similarly to the read operation, the cell read and the write-back operation are successively performed.

As shown in FIG. 5, similarly to step S10 of the read operation, upon receiving the active command and the address signal from the host 100, the row decoder 11 activates the selected word line WL of the selected bank BNK (step S10).

The controller 14 receives the write command (step S20). More specifically, the CA input circuit 15 receives the write command and the column address C_AD via the command/address lines CA0 to CA9. The CA input circuit 15 transmits the decoded write command to the controller 14 via the command circuit 17. The CA input circuit 15 also transmits the column address C_AD to the column decoder 13. The column decoder 13 transmits the result of decoding the column address C_AD to the column controller 12.

Similarly to the cell read (steps S12 to S14) in the read operation shown in FIG. 3, the column controller 12 performs ECC processing for the read data, and stores the read data (corrected data) and parity bits in the page buffer 25.

After storing the read data (corrected data) and parity bits in the page buffer 25, the column controller 12 starts the write operation of the write data simultaneously with the write-back operation.

More specifically, after the end of step S14, if the ECC decoder 31 corrects the data, similarly to the read operation (YES in step S15), the column controller 12 performs the write-back operation (step S16). On the other hand, if the ECC decoder 31 corrects no data (NO in step S15), the write-back operation is skipped.

After the end of step S14, the write data are stored in the page buffer 25, thereby replacing the read data by the write data (step S21).

Next, the ECC encoder 32 encodes the write data transferred from the page buffer 25, thereby generating parity bits (step S22).

After the end of step S16 or S22, the multiplexer 26 switches the data path (step S23). More specifically, the first input terminal of the multiplexer 26 is selected in accordance with the control signal SWB to couple the ECC encoder 32 and the write driver 23.

Next, the write data are written in the selected memory cells MC (step S24). More specifically, the column selector 21 selects the plurality of bit lines BL and the plurality of source lines SL in accordance with the decoding result of the column address C_AD. The write driver 23 transmits a write pulse to one of the pair of the bit line BL and source line SL in accordance with the write data, and causes a write current to flow through the memory cells MC. This writes the data in the memory cells MC.

Steps S21 to S24 in FIG. 5 correspond to the cell write.

Similarly to step S17 of the read operation, the pre-charge operation (deactivation) of the selected bank BNK is performed. This ends the write operation. Note that if the write or read operation is successively performed in the selected word line WL of the selected bank BNK, the pre-charge operation may be skipped.

Note that the data length of the read data (page) may be different from that of the write data. That is, the data length of the write data may be shorter than that of the page.

Furthermore, in the example of FIG. 5, a case in which the write-back operation in step S16 is processed in parallel with storage the write data in step S21 and encoding in step S22 has been explained. However, after the end of the write-back operation in step S16, storage of the write data in step S21 may be executed.

1.4.2 Data Flow of Write Operation

Figure 6:
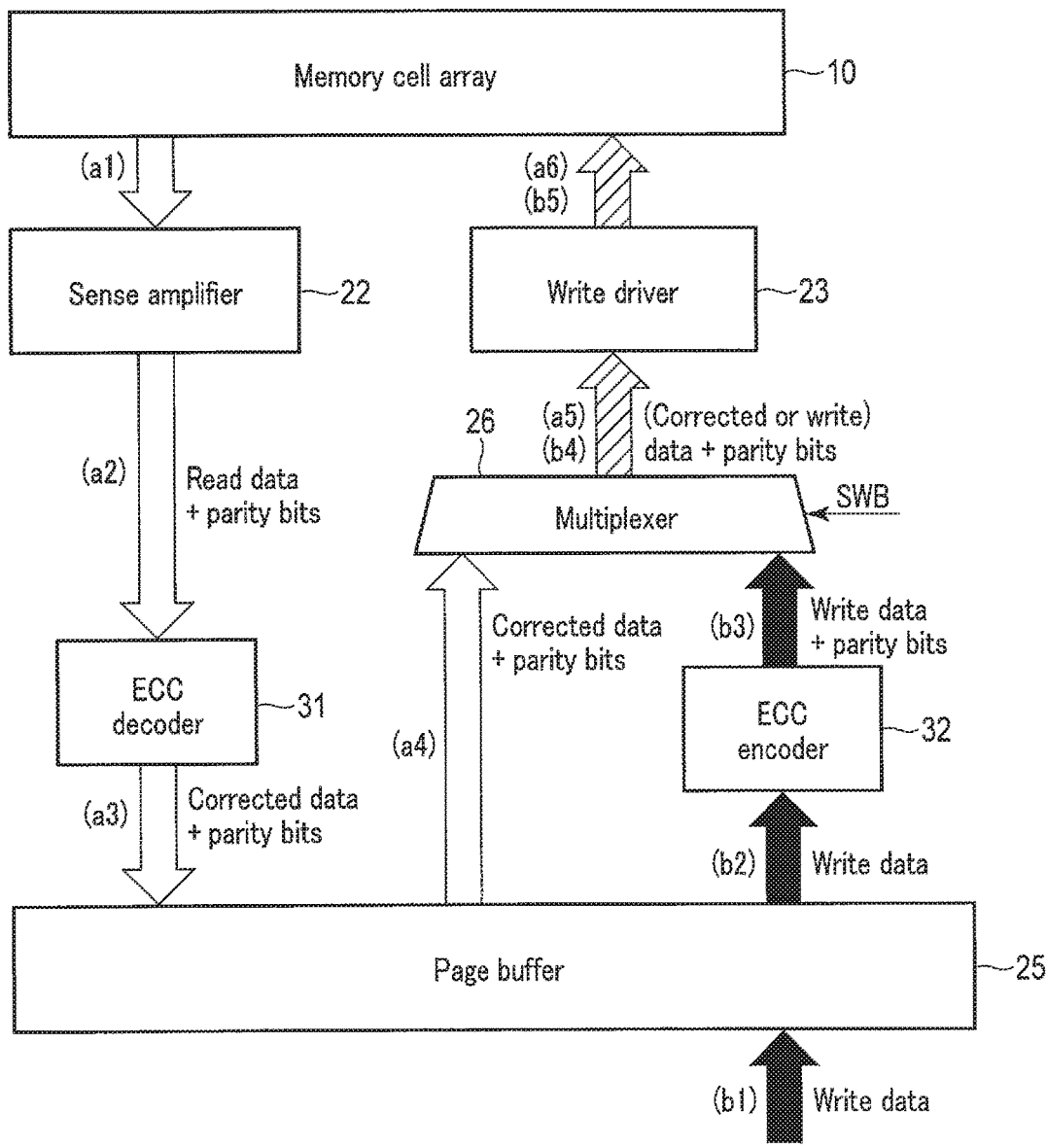
FIG. 6 is a flowchart illustrating the flow of data and parity in the semiconductor memory device according to the first embodiment.

The data flow of the write operation will be described with reference to FIG. 6. In an example shown in FIG. 6, for the sake of descriptive simplicity, the column selector 21 is omitted. FIG. 6 shows a case in which error correction is performed for the read data. Referring to FIG. 6, each white arrow indicates the first operation, that is, the read data (or corrected data), each black arrow indicates the second operation, that is, the write data, and each hatched arrow indicates the corrected data or the write data.

As shown in FIG. 6, in the first operation, the sense amplifier 22 reads the read data and parity bits from the memory cell array 10 (reference symbol a1), and transmits them to the ECC decoder 31 (reference symbol a2). The ECC decoder 31 executes ECC processing, and transmits the corrected data and parity bits to the page buffer 25 (reference symbol a3). The corrected data and parity bits held in the page buffer 25 are transmitted, via the multiplexer 26 (reference symbol a4), to the write driver 23 (reference symbol a5), and written back to the memory cell array 10 (reference symbol a6). At this time, the multiplexer 26 couples the page buffer 25 and the write driver 23 in accordance with the control signal SWB.

The second operation will be described next. In the second operation, the write data are transmitted from the DQ circuit 18 to the page buffer 25 (reference symbol b1). The write data stored in the page buffer 25 are transmitted to the ECC encoder 32 (reference symbol b2), and added with the parity bits. The write data and parity bits are transmitted, via the multiplexer 26 (reference symbol b3), to the write driver 23 (reference symbol b4), and written in the memory cell array 10 (reference symbol b5). At this time, the multiplexer 26 couples the write driver 23 and the ECC encoder 32 in accordance with the control signal SWB.

1.5 Effect of Embodiment

With the configuration according to this embodiment, it is possible to improve the throughput. This effect will be described in detail.

In the write-back operation, when writing back the corrected data stored in the page buffer, there is known a method of generating parity bits for the corrected data by the ECC encoder and then writing the corrected data and the generated parity bits to the memory cell array. In this case, a processing time for encoding the corrected data is required.

To the contrary, in the configuration according to this embodiment, by successively performing the read operation and the write operation, it is possible to omit encoding of the corrected data, that is, generation of parity bits when writing back the corrected data. More specifically, at the time of data read, the parity bits used for error correction are stored in the page buffer 25 together with the corrected data. Then, at the time of write-back, the corrected data and parity bits stored in the page buffer 25 are written back, thereby making it possible to omit generation of parity bits for the corrected data. This can save the encoding time of the corrected data. That is, the period tRC can be shortened. Therefore, it is possible to improve the throughput of the semiconductor memory device.

Furthermore, the configuration according to this embodiment includes the multiplexer 26 that selects one of the page buffer 25 and the ECC encoder 32 and couples it to the write driver 23. This can transmit the corrected data and parity bits stored in the page buffer 25 to the write driver 23 without intervention of the ECC encoder 32.

2. Second Embodiment

The second embodiment will be described next. The second embodiment will describe generation of a control signal SWB. Only the difference from the first embodiment will be explained below.

2.1 Sequence of Controller in Write Operation

The sequence of a controller 14 in a write operation will be described first with reference to FIG. 7.

As shown in FIG. 7, in the controller 14, when writing write data (to be referred to as a "write sequence" hereinafter), the sequence is performed in roughly three stages, that is, assert processing is performed for three control signals. More specifically, upon receiving a write command, a column address C_AD, and write data, the controller 14 asserts a write enable signal BWEN1. Next, when the first period elapses, the controller 14 asserts a write enable signal BWEN2. That is, the write enable signal BWEN2 is a signal obtained by delaying the write enable signal BWEN1 by the first period. The write data are loaded from a DQ circuit 18 into a page buffer 25 based on the write enable signal BWEN2 and the column address C_AD. An ECC circuit 24 encodes the write data loaded into the page buffer 25. Furthermore, when the second period elapses after the write enable signal BWEN2 is asserted, the controller 14 asserts a write enable signal BWENS. That is, the write enable signal BWENS is a signal obtained by delaying the write enable signal BWEN2 by the second period. A write driver 23 starts to apply a write pulse based on the write enable signal BWENS.

On the other hand, in the controller 14, in the case of write-back (to be referred to as a "write-back sequence" hereinafter), the assertion processes of the write enable signals BWEN1 and BWEN2 are omitted, and the assertion processing of the write enable signal BWENS is performed.

2.2 Transmission/Reception of Write Enable Signals

Transmission/reception of the write enable signals BWEN1, BWEN2, and BWENS will be described in more detail with reference to FIG. 8. An example of FIG. 8 shows generation of a write pulse corresponding to one column.

As shown in FIG. 8, the write enable signal BWEN1 is transmitted to, for example, a delay circuit 50 provided in the controller 14. The delay circuit 50 transmits the write enable signal BWEN2 obtained by delaying the write enable signal BWEN1 by the first period to, for example, a delay circuit 51 and a BWEN2_CAD generator 53, both of which are provided in the controller 14. For example, to adjust the timing of loading the write data into the page buffer 25, the delay circuit 50 delays the write enable signal BWEN1 by the first period. Note that the delay circuit 50 and 51 and the BWEN2_CAD generator 53 may be provided outside the controller 14.

Upon receiving the column address C_AD and the write enable signal BWEN2, the BWEN2_CAD generator 53 generates (asserts) a control signal BWEN2_<C_AD> corresponding to the column, and transmits it to the page buffer 25. The page buffer 25 stores the write data in a designated area in the page buffer 25 based on the control signal BWEN2_<C_AD>. After that, the write data are transmitted to an ECC encoder 32, and added with parity bits.

The delay circuit 51 transmits the write enable signal BWENS obtained by delaying the write enable signal BWEN2 by the second period to, for example, a write pulse generator 54 provided in the write driver 23. The delay circuit 51 delays the write enable signal BWEN2 by the second period so that, for example, the write driver 23 starts to apply a write pulse after the end of generation of the parity bits by the ECC encoder 32.

For example, a delay circuit 52 provided in a column decoder 13 delays the column address C_AD by the third period and then transmits it to the write pulse generator 54 in synchronism with the timing at which the write pulse generator 54 receives the write enable signal BWENS. The write pulse generator 54 generates a write pulse (reference symbol "WP") based on the write enable signal BWENS and the column address C_AD.

2.3 SWB Generator

An SWB generator will be described with reference to FIG. 9. The SWB generator according to this embodiment generates the control signal SWB by paying attention to the control signal BWEN2_<C_AD> generated (asserted) when writing the write data. The SWB generator is provided in, for example, the controller 14, and generates the control signal SWB for controlling a multiplexer 26. In an example shown in FIG. 9, if the control signal SWB is at low ("L") level, the multiplexer 26 selects the first input terminal to couple the write driver 23 and the ECC encoder 32. If the control signal SWB is at high ("H") level, the multiplexer 26 selects the second input terminal to couple the write driver 23 and the page buffer 25.

Figures 9, 10:
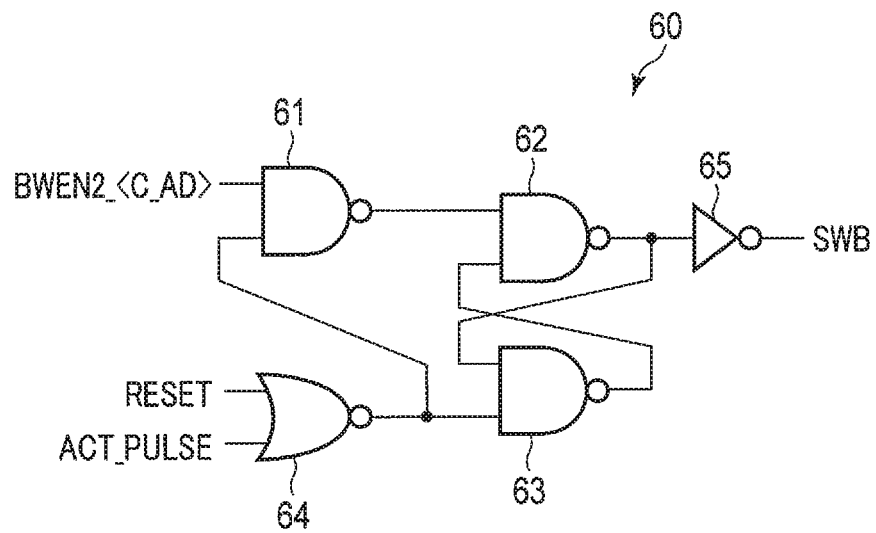
FIG. 9 is a circuit diagram showing an SWB generator provided in the semiconductor memory device according to the second embodiment.
FIG. 10 is a table showing the truth table of the SWB generator provided in the semiconductor memory device according to the second embodiment.

As shown in FIG. 9, an SWB generator 60 includes three NAND circuits 61 to 63, a NOR circuit 64, and an inverter 65.

The control signal BWEN2_<C_AD> is input to the first input terminal of the NAND circuit 61, and the second input terminal of the NAND circuit 61 is coupled to the output terminal of the NOR circuit 64. The output terminal of the NAND circuit 61 is coupled to the first input terminal of the NAND circuit 62.

The second input terminal of the NAND circuit 62 is coupled to the output terminal of the NAND circuit 63. The output terminal of the NAND circuit 62 is coupled to the first input terminal of the NAND circuit 63 and the input terminal of the inverter 65.

A reset signal RESET is input to the first input terminal of the NOR circuit 64, and a control signal ACT_PULSE is input to the second input terminal of the NOR circuit 64. The reset signal RESET is a signal for setting the SWB generator 60 in a reset state, and is asserted at "H" level. The control signal ACT_PULSE is a signal that is set at "H" level for a predetermined period when the controller 14 receives an active command. The output terminal of the NOR circuit 64 is coupled to the second input terminal of the NAND circuit 63.

A signal output from the inverter 65 is transmitted to the multiplexer 26 as the control signal SWB.

Note that FIG. 9 shows an example of a latch circuit forming the SWB generator. The present invention, however, is not limited to this. Any SR latch circuit in which set and reset operations are executed in accordance with the control signals BWEN2_<C_AD> and ACT_PULSE can be adopted.

FIG. 10 shows the truth table of the SWB generator 60. Note that in an example shown in FIG. 10, the reset signal RESET is at "L" level.

As shown in FIG. 10, if both the control signals ACT_PULSE and BWEN2_<C_AD> are at "L" level, the control signal SWB is held in the previous state. If the control signal BWEN2_<C_AD> is at "H" level, the control signal SWB is set at "L" level. If the control signal ACT_PULSE is at "H" level, the control signal SWB is set at "H" level. In this embodiment, there is no state in which both the control signals ACT_PULSE and BWEN2_<C_AD> are set at "H" level.

For example, upon receiving the active command, the controller 14 temporarily sets the control signal ACT_PULSE at "H" level. At this time, the SWB generator 60 sets the control signal SWB at "H" level. After that, the controller 14 sets the control signal ACT_PULSE at "L" level, and the SWB generator 60 holds the control signal SWB at "H" level. In this state, for example, a write-back operation is executed. When writing the write data, the control signal BWEN2_<C_AD> is set at "H" level. Thus, the SWB generator 60 sets the control signal SWB at "L" level. In this state, the write data are written.

2.4 Effect of Embodiment

The arrangement according to this embodiment is applicable to the first embodiment. This can obtain the same effect as in the first embodiment.

3. Third Embodiment

The third embodiment will be described next. The third embodiment will describe a write operation different from the write operation according to the first embodiment. Only the difference from the first and second embodiment will be explained below.

3.1 Write Operation

The write operation according to this embodiment will be described with reference to FIG. 11. The write operation includes the cell read, the write operation corresponding to the column address C_AD as a write target, and write-back operation corresponding to the column address C_AD which is included in the page including the column address C_AD as a write-back target and is different from the column address C_AD as a write-back target. The write operation may be performed in parallel to the write-back operation.

As shown in FIG. 11, upon receiving the active command and the address signal from the host 100, the row decoder 11 activates the selected word line WL of the selected bank BNK (step S10).

The controller 14 receives the write command (step S20).

Similarly to the cell read (steps S12 to S14) in the read operation shown in FIG. 3, the column controller 12 performs ECC processing for the read data, and stores the read data (corrected data) and parity bits in the page buffer 25.

After storing the read data (corrected data) and parity bits in the page buffer 25, the column controller 12 starts the write operation of the write data simultaneously with the write-back operation.

If the column address CAD as the write-back operation is different from the column address C_AD as the write operation (No in step S30), the column controller 12 performs the write-back operation corresponding to the column address C_AD as the write-back operation.

More specifically, if the ECC decoder 31 corrects the data (YES in step S15), the column controller 12 performs the write-back operation (step S16). On the other hand, if the ECC decoder 31 corrects no data (NO in step S15), the write-back operation is skipped.

On the other hand, if the column address C_AD as the write-back operation is identical to the column address C_AD as the write operation (Yes in step S30), the column controller 12 performs the write operation corresponding to the column address C_AD as the write operation.

More specifically, after the end of step S14, the write data are stored in the page buffer 25, thereby replacing the read data by the write data (step S21).

Next, the ECC encoder 32 encodes the write data transferred from the page buffer 25, thereby generating parity bits (step S22).

Next, the write data are written in the selected memory cells MC (step S24).

Next, the pre-charge operation (deactivation) of the selected hank BNK is performed. This ends the write operation.

3.2 Effect of Embodiment

With the configuration according to this embodiment, it is possible to obtain the same effect as in the first embodiment.

4. Modification

The semiconductor memory device according to each of the above embodiments includes a memory cell array (10 in FIG. 1) with a plurality of memory cells (MC in FIG. 2), an ECC (Error Checking and Correcting) circuit (24 in FIG. 1) with an encoder (32 in FIG. 1) for generating error correcting codes when writing write data in the plurality of memory cells (MC in FIG. 2), and a decoder (31 in FIG. 1) for performing, when reading read data from the plurality of memory cells (MC in FIG. 2), correcting processing of the read data based on the error correcting codes (parity bits), a page buffer (25 in FIG. 1) capable of storing the write data, corrected data corrected by the correcting processing of read data, and the error correcting codes used for the correcting processing, and a multiplexer (26 in FIG. 1) having a first input terminal coupled to the encoder, a second input terminal coupled to the page buffer, and an output terminal coupled to the memory cell array, in which the first input terminal is selected when writing the write data in the plurality of memory cells and the second input terminal is selected when writing the corrected data in the plurality of memory cells.

By applying the above embodiments, it is possible to provide the semiconductor memory device capable of improving the throughput. Note that the embodiment is not limited to the above-described ones and various modifications can be made.

In each of the above embodiments, the STT-MRAM has been exemplified as a semiconductor memory device. The present invention, however, is not limited to this. For example, the present invention is applicable to all semiconductor memory devices that have an element for storing data using a change in resistance like resistance change memories of the same type as the MRAM, such as an ReRAM (Resistive Random Access Memory) and PCRAM (Phase-Change Random Access Memory). In addition, the present invention is applicable to semiconductor memory devices that incorporate an ECC circuit and immediately perform, if a data error occurs in the read operation, a write-back operation into memory cells based on the information about the data error, regardless of whether the devices are volatile or nonvolatile.

Furthermore, the terms "connect" and "couple" in the above embodiments include not only direct coupling but also indirect coupling via another element such as a transistor or resistance.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a memory cell array including a plurality of memory cells;
    an ECC (Error Checking and Correcting) circuit including an encoder and a decoder, the encoder being configured to generate error correcting codes when writing write data in the plurality of memory cells, and the decoder being configured to perform, when reading read data from the plurality of memory cells, correcting processing of the read data based on the error correcting codes;
    a page buffer configured to store the write data, corrected data corrected by the correcting processing of the read data, and the error correcting codes used for the correcting processing; and
    a multiplexer including a first input terminal coupled to the encoder, a second input terminal coupled to the page buffer, and an output terminal coupled to the memory cell array, the first input terminal being selected when writing the write data in the plurality of memory cells, and the second input terminal being selected when writing the corrected data in the plurality of memory cells;
    wherein a write operation includes a first operation of reading the read data from the plurality of memory cells, a second operation of writing the corrected data and the error correcting codes used for the correcting processing in the plurality of memory cells, and a third operation of writing, in the plurality of memory cells, the write data and error correcting codes generated based on the write data, and the first operation and the second operation are successively executed.

2. The device according to claim 1, wherein a read operation includes the first operation and the second operation, and the first operation and the second operation are successively executed.

3. The device according to claim 2, wherein the first operation includes an operation of performing the correcting processing of the read data, and an operation of storing the corrected data and the error correcting codes used for the correcting processing in the page buffer.

4. The device according to claim 2, wherein the first operation and the second operation are performed for the same address in the memory cell array.

5. The device according to claim 1, wherein the second operation is performed when the read data are corrected by the correcting processing in the first operation.

6. The device according to claim 1, wherein the first operation includes an operation of performing the correcting processing of the read data, and an operation of storing the corrected data and the error correcting codes used for the correcting processing in the page buffer.

7. The device according to claim 1, wherein the first operation, the second operation, and the third operation are performed for the same address in the memory cell array.

8. The device according to claim 1, wherein the first input terminal is coupled to the page buffer via the encoder, and the second input terminal is coupled to the page buffer without intervention of the encoder.

9. The device according to claim 1, further comprising:
    a signal generator configured to generate a control signal for controlling the multiplexer in accordance with write of the write data and write of the corrected data.

10. The device according to claim 1, further comprising:
    a plurality of bit lines and a plurality of source lines coupled to the plurality of memory cells, respectively;
    a selector configured to select at least one of the plurality of bit lines and at least one of the plurality of source lines based on a column address;
    a sense amplifier configured to read the data from the plurality of memory cells via the selector; and
    a write driver configured to apply a write voltage to the plurality of memory cells via the selector,
    wherein an input terminal of the decoder is coupled to the plurality of memory cells via the selector and the sense amplifier, and wherein the output terminal of the multiplexer is coupled to the plurality of memory cells via the write driver and the selector.

11. The device according to claim 1, wherein the memory cell includes a magnetoresistive effect element.

12. The device according to claim 1, wherein the semiconductor memory device comprises an MRAM (Magnetoresistive Random Access Memory).

13. A data write method for a semiconductor memory device, comprising:
- reading data and error correcting codes from a plurality of memory cells included in a memory cell array;
- performing error detection and correction of the data using the error correcting codes;
- storing corrected data and the error correcting codes in a page buffer;
- writing back the corrected data and the error correcting codes to the plurality of memory cells, the corrected data and the error correcting codes being stored in the page buffer; and
- writing write data and error correcting codes generated based on the write data in the plurality of memory cells,
- wherein the reading, the performing, the storing, and the writing back are successively executed.

14. The method according to claim 13, wherein the reading, the writing back, and the writing are performed for the same address in the memory cell array.

\* \* \* \* \*